(12) United States Patent  
Amarnath et al.

(10) Patent No.: US 9,099,492 B2  
(45) Date of Patent: Aug. 4, 2015

(54) METHODS OF FORMING REPLACEMENT GATE STRUCTURES WITH A RECESSED CHANNEL

(75) Inventors: Kuldeep Amarnath, San Jose, CA (US); Michael Hargrove, Clinton Corners, NY (US); Srikanth Samavedam, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 126 days.

(21) Appl. No.: 13/429,787

(22) Filed: Mar. 26, 2012

(65) Prior Publication Data

US 2013/0248985 A1 Sep. 26, 2013

(51) Int. Cl.
*H01L 29/66* (2006.01)
*H01L 21/336* (2006.01)
*H01L 29/78* (2006.01)

(52) U.S. Cl.
CPC .... *H01L 29/66545* (2013.01); *H01L 29/66553* (2013.01); *H01L 29/66621* (2013.01); *H01L 29/7848* (2013.01); *H01L 29/66636* (2013.01)

(58) Field of Classification Search
CPC ............... H01L 29/66545; H01L 29/66621; H01L 29/66628; H01L 21/823857; H01L 29/66606; H01L 27/1203; H01L 29/66477; H01L 21/31111; H01L 21/31116
USPC ....... 257/E21.19–E21.21, E21.394–E21.458, 257/E21.615–E21.694, E29.049–E29.067, 257/E29.237, E29.256–E29.26, E29.299, 257/E21.428–E21.43, E21.618, E21.634, 257/E21.431–E21.435, E21.619–E21.62, 257/E21.444, E21.429, 410, E29.255, 257/E21.41, E21.415, 330, E21.409, 257/E21.438, E27.062, E29.056, E29.266, 257/E29.267, 369, 408, 412, E21.158, 257/E21.335, E21.437, E27.064, E29.055, 257/E29.262, E29.286, 19, 347, 368, 374, 257/387, 411, E21.205, E21.209, E21.446, 257/E21.453, E21.462, E21.576, E21.577, 257/E21.579, E21.621, E21.632, E21.637, 257/E21.664, E21.703, E25.016, E27.06, 257/E27.104, E27.112, E29.027, E29.066, 257/E29.084; 438/135, 142, 151, 183, 270, 438/300, 591, 595, 163, 184, 230, 299, 301, 438/585, 149, 153, 154, 186, 195, 197, 203, 438/216, 218, 282, 283, 287, 478, 491, 785
See application file for complete search history.

(56) References Cited

U.S. PATENT DOCUMENTS 6,251,763 B1   6/2001   Inumiya et al. ............... 438/595
6,303,418 B1   10/2001  Cha et al. ...................... 438/199

(Continued)

FOREIGN PATENT DOCUMENTS

DE   102005052055 B3   4/2007   .............. H01L 27/12

OTHER PUBLICATIONS

Translation of Official Communication from German Patent Office for German Patent Application No. 10 2010 002 450. 3 dated Mar. 30, 2011.

*Primary Examiner* — Colleen A Matthews
*Assistant Examiner* — Junaiden Mirsalahuddin
(74) *Attorney, Agent, or Firm* — Amerson Law Firm, PLLC (57) ABSTRACT

Disclosed herein are various methods of forming replacement gate structures with a recessed channel region. In one example, the method includes forming a sacrificial gate structure above a semiconducting substrate, removing the sacrificial gate structure to thereby define an initial gate opening having sidewalls and to expose a surface of the substrate and performing an etching process on the exposed surface of the substrate to define a recessed channel in the substrate. The method includes the additional steps of forming a sidewall spacer within the initial gate opening on the sidewalls of the initial gate opening to thereby define a final gate opening and forming a replacement gate structure in the final gate opening.

16 Claims, 6 Drawing Sheets

(56) References Cited

U.S. PATENT DOCUMENTS

| | | | |
|---|---|---|---|
| 6,348,385 B1 | 2/2002 | Cha et al. | 438/287 |
| 7,361,565 B2 | 4/2008 | Shin et al. | 438/383 |
| 7,399,663 B2 | 7/2008 | Hoentschel et al. | 438/151 |
| 7,586,153 B2 | 9/2009 | Hoentschel et al. | 257/344 |
| 8,198,152 B2 | 6/2012 | Beyer et al. | 438/199 |
| 2004/0137688 A1 | 7/2004 | Chang et al. | 438/303 |
| 2005/0090066 A1* | 4/2005 | Zhu et al. | 438/300 |
| 2006/0001095 A1* | 1/2006 | Doris et al. | 257/348 |
| 2006/0046399 A1 | 3/2006 | Lindert et al. | 438/282 |
| 2007/0202641 A1 | 8/2007 | Wei et al. | 438/194 |
| 2008/0023692 A1 | 1/2008 | Wirbeleit et al. | 257/19 |
| 2009/0218597 A1 | 9/2009 | Liu et al. | 257/192 |
| 2009/0294860 A1 | 12/2009 | Mowry et al. | 257/368 |
| 2009/0321820 A1* | 12/2009 | Yamakawa | 257/330 |
| 2010/0133628 A1 | 6/2010 | Frohberg et al. | 257/410 |

\* cited by examiner

$$\Theta = \tan^{-1}\sqrt{2} = 54.7 \text{ degrees}$$

$$\delta = \frac{\sqrt{6}D}{S} = \frac{\sqrt{6}R_{100}T}{R_{100}/R_{111}} = \sqrt{6}R_{111}$$

Where:

D = etch depth

δ = overhang

S = the anisotropy of the material and the etchant $R_{100}$ = rate of etch in <100> direction $R_{111}$ = rate of etch in <111> direction T = etch time

METHODS OF FORMING REPLACEMENT GATE STRUCTURES WITH A RECESSED CHANNEL

BACKGROUND OF THE INVENTION

1. Field of the Invention

Generally, the present disclosure relates to the manufacturing of sophisticated semiconductor devices, and, more specifically, to various methods of forming replacement gate structures with a recessed channel region.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent one important type of circuit element used in manufacturing such integrated circuit devices. A field effect transistor, irrespective of whether an NFET transistor or a PFET transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

For many early device technology generations, the gate electrode structures of most transistor elements have comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), and the like.

Figure 1A:
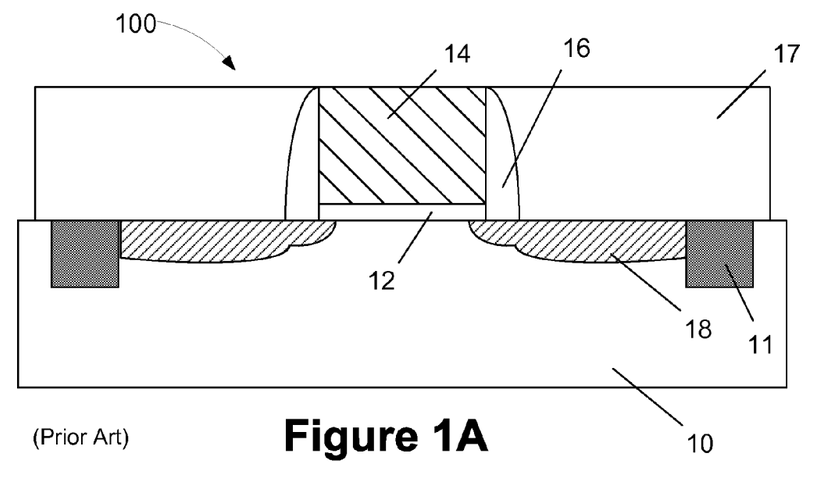
FIGS. 1A-1D depict one illustrative prior art process flow for forming a semiconductor device using a gate last approach.

One well-known processing method that has been used for forming a transistor with a high-k/metal gate structure is the so-called "gate last" or "replacement gate" technique. FIGS. 1A-1D depict one illustrative prior art method for forming an HK/MG replacement gate structure using a gate last technique. As shown in FIG. 1A, the process includes the formation of a basic transistor structure 100 above a semiconducting substrate 10 in an active area defined by a shallow trench isolation structure 11. At the point of fabrication depicted in FIG. 1A, the device 100 includes a sacrificial gate insulation layer 12, a dummy or sacrificial gate electrode 14, sidewall spacers 16, a layer of insulating material 17 and source/drain regions 18 formed in the substrate 10. The various components and structures of the device 100 may be formed using a variety of different materials and by performing a variety of known techniques. For example, the sacrificial gate insulation layer 12 may be comprised of silicon dioxide, the sacrificial gate electrode 14 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NFET devices and P-type dopant for PFET devices) that are implanted into the substrate 10 using known masking and ion implantation techniques. Of course, those skilled in the art will recognize that there are other features of the transistor 100 that are not depicted in the drawings for purposes of clarity. For example, so-called halo implant regions are not depicted in the drawings, as well as various layers or regions of silicon germanium that are typically found in high-performance PFET transistors. At the point of fabrication depicted in FIG. 1A, the various structures of the device 100 have been formed and a chemical mechanical polishing process (CMP) has been performed to remove any materials above the sacrificial gate electrode 14 (such as a protective cap layer (not shown) comprised of silicon nitride) so that the sacrificial gate electrode 14 may be removed.

Figure 1B:
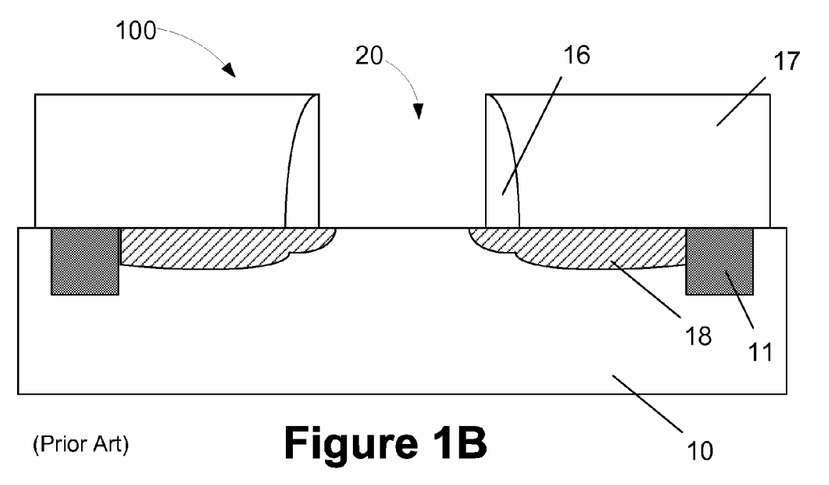

As shown in FIG. 1B, one or more etching processes are performed to remove the sacrificial gate electrode 14 and the sacrificial gate insulation layer 12 to thereby define a gate opening 20 where a replacement gate structure will subsequently be formed. A masking layer that is typically used in such etching processes is not depicted for purposes of clarity. Typically, the sacrificial gate insulation layer 12 is removed as part of the replacement gate technique, as depicted herein. However, the sacrificial gate insulation layer 12 may not be removed in all applications.

Figure 1C:
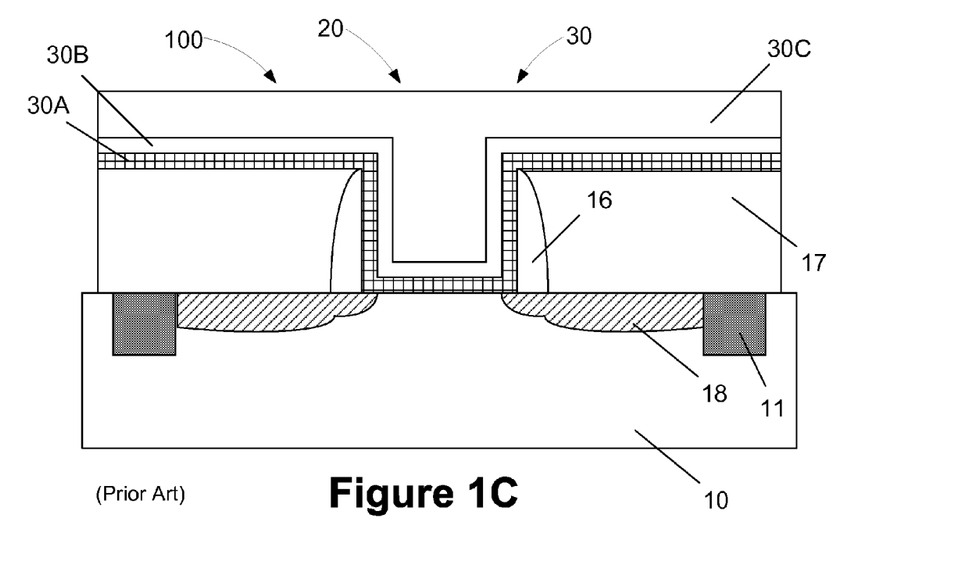
Figure 1D:
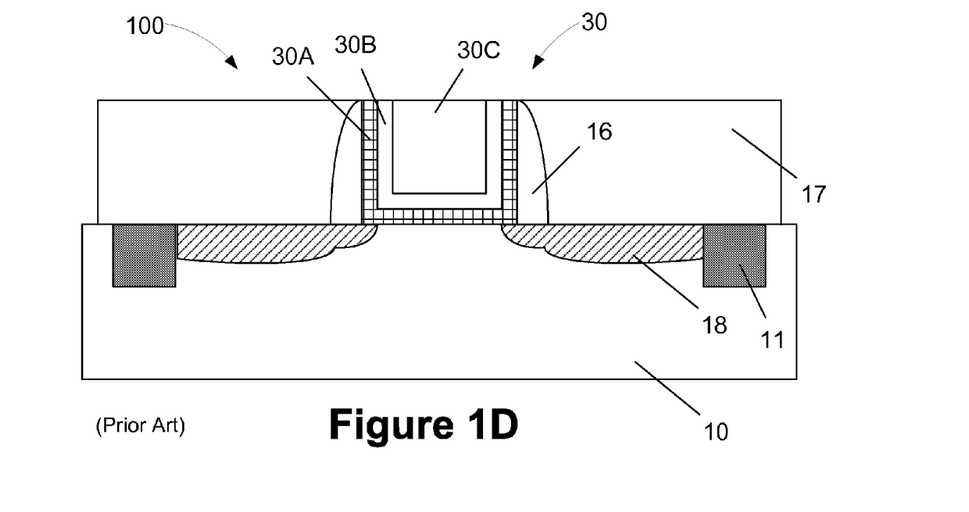

Next, as shown in FIG. 1C, various layers of material that will constitute a replacement gate structure 30 are formed in the gate opening 20. However, although not depicted in the drawings, the generally square-edged gate opening may cause certain problems in forming such layers of material in the gate opening 20. For example, such a square-edged gate opening 20 may lead to the formation of voids in one or more of the layers of material that will be formed in the gate opening 20. In one illustrative example, the replacement gate structure 30 is comprised of a high-k gate insulation layer 30A having a thickness of approximately 2 nm, a work function adjusting layer 30B comprised of a metal (e.g., a layer of titanium nitride with a thickness of 2-5 nm) and a bulk metal layer 30C (e.g., aluminum). Ultimately, as shown in FIG. 1D, a CMP process is performed to remove excess portions of the gate insulation layer 30A, the work function adjusting layer 30B and the bulk metal layer 30C positioned outside of the gate opening 20 to define the replacement gate structure 30.

Device designers are under constant pressure to improve the electrical performance characteristics of semiconductor devices, such as transistors, and the overall performance capabilities of integrated circuit devices that incorporate such devices. One technique that has been and continues to be employed to improve the performance of such transistors is to reduce or scale the channel length of such transistors. As device dimensions have decreased, device designers have resorted to other techniques to improve device performance. One such method involves the use of channel stress engineering techniques on transistors to create a tensile stress in the channel region for NFET transistors and to create a compressive stress in the channel region for PFET transistors. These stress conditions improve charge carrier mobility of the devices—electrons for NFET devices and holes for PFET devices.

One commonly employed stress engineering technique involves the formation of specifically made silicon nitride layers that are selectively formed above appropriate transistors, i.e., a layer of silicon nitride that is intended to impart a tensile stress in the channel region of an NFET transistor would only be formed above the NFET transistors. Such selective formation may be accomplished by masking the PFET transistors and then blanket depositing the layer of silicon nitride, or by initially blanket depositing the layer of silicon nitride across the entire substrate and then performing an etching process to selectively remove the silicon nitride from above the PFET transistors. Conversely, for PFET transistors, a layer of silicon nitride that is intended to impart a compressive stress in the channel region of a PFET transistor is formed above the PFET transistors. The techniques employed in forming such nitride layers with the desired tensile or compressive stress are well known to those skilled in the art. Another stress engineering technique that is typically employed when forming a PFET transistor involves the formation of epitaxial-deposited silicon-germanium source/drain regions, and the formation of an epitaxial-deposited silicon-germanium layer under the channel region of the PFET device. Additional stress engineering techniques that have been performed on NFET transistors include the formation of silicon-carbon source/drain regions to induce a desired tensile stress in the channel region of an NFET transistor.

In general, it is more beneficial if the stress-inducing material is positioned as close as reasonably possible to the channel region of the transistor. Moreover, to the extent possible, any process flow used in forming such stress-inducing material should be implemented in a manner such that relaxation of the induced stress in the channel region caused by subsequent processing operations is limited.

Another issue that device designers have had to address relates to the formation of conductive contacts to the source/drain regions of a transistor. Ideally, the resistance between the conductive contact and the source/drain region is as small as possible. To that end, in most modern semiconductor devices, metal silicide regions are formed in the source and drain regions to reduce the contact resistance. The typical steps performed to form metal silicide regions are: (1) depositing a layer of refractory metal; (2) performing an initial heating process causing the refractory metal to react with underlying silicon-containing material; (3) performing an etching process to remove unreacted portions of the layer of refractory metal; and (4) performing an additional heating process to form the final phase of the metal silicide. The details of such silicidation processes are well known to those skilled in the art.

Additionally, many current generation devices are formed with raised source/drain regions, i.e., the upper surface of the source/drain region is at a level that is above the nominal surface of the substrate. This structure and technique is employed to reduce the contact resistance of the device. However, depending upon the type of device under construction, the formation of these raised source/drain regions can involve additional epitaxial deposition processes which lead to increased manufacturing time and cost.

The present disclosure is directed to various, more efficient methods of forming replacement gate structures with a recessed channel region that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming replacement gate structures with a recessed channel region. In one example, the method includes forming a sacrificial gate structure above a semiconducting substrate, removing the sacrificial gate structure to thereby define an initial gate opening having sidewalls and to expose a surface of the substrate and performing an etching process on the exposed surface of the substrate to define a recessed channel in the substrate. The method includes the additional steps of forming a sidewall spacer within the initial gate opening on the sidewalls of the initial gate opening to thereby define a final gate opening and forming a replacement gate structure in the final gate opening.

Another illustrative method disclosed herein of forming a transistor includes the steps of forming a sacrificial gate structure above a semiconducting substrate, forming a plurality of source/drain regions for the transistor, wherein the source/drain regions have an upper surface, removing the sacrificial gate structure to thereby define an initial gate opening having sidewalls and to expose a surface of the substrate and performing an etching process through the initial gate opening on the exposed surface of the substrate to define a recessed channel in the substrate, wherein the upper surface of the source/drain regions is positioned at a level that is above a level of the recessed channel. In this example, the method includes the additional steps of forming a sidewall spacer within the initial gate opening on the sidewalls of the initial gate opening to thereby define a final gate opening having a non-square-edged entrance and forming a replacement gate structure in the final gate opening, wherein the replacement gate structure includes a gate insulation layer comprised of a high-k insulating material and a gate electrode comprised of at least one metal layer.

One illustrative embodiment of a device disclosed herein includes a semiconducting substrate having an upper surface, a recessed channel formed in the substrate, wherein the recessed channel has an upper surface that is at a level that is below a level of the upper surface of the substrate, a tapered surface extending between the upper surface of the recessed channel and the upper surface of the substrate, a gate insulation layer formed on the recessed channel and a gate electrode formed above the gate insulation layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming replacement gate structures with a recessed channel region. As will be readily apparent to those skilled in the art upon a complete reading of the present application, the present method is applicable to a variety of technologies, e.g., NFET, PFET, CMOS, etc., and is readily applicable to a variety of devices, including, but not limited to, ASICs, logic devices, memory devices, etc. With reference to FIGS. 2A-2G, various illustrative embodiments of the methods and devices disclosed herein will now be described in more detail.

Figure 2A:
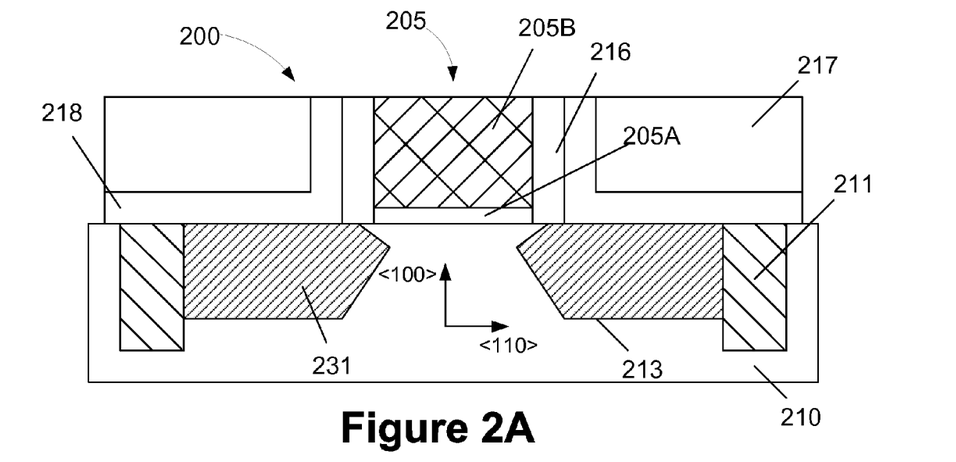
FIGS. 2A-2G depict various illustrative examples of forming replacement gate structures with a recessed channel region.

FIG. 2A is a simplified view of an illustrative transistor 200 at an early stage of manufacturing. The transistor 200 may be either an NFET transistor or a PFET transistor. The transistor 200 is formed in and above an active region defined by isolation structures 211 formed in a semiconducting substrate 210. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 210 may also be made of materials other than silicon.

At the point of fabrication depicted in FIG. 2A, the transistor 200 includes a sacrificial gate structure 205 comprised of a sacrificial gate insulation layer 205A, a dummy or sacrificial gate electrode 205B, sidewall spacers 216, a layer of insulating material 217, a stress-inducing layer 218 and source/drain regions 231 formed in the substrate 210. The various components and structures of the device 200 may be formed using a variety of different materials and by performing a variety of known techniques.

For example, the sacrificial gate insulation layer 205A may be comprised of silicon dioxide, the sacrificial gate electrode 205B may be comprised of polysilicon, the sidewall spacers 216 may be comprised of silicon nitride and the layer of insulating material 217 may be comprised of silicon dioxide. The stress-inducing layer 218 may be comprised of silicon nitride and it may be manufactured in such a way so as to impart a desired stress (tensile for an NFET transistor or compressive for a PFET transistor) on what will become the channel region of the transistor 200. The techniques used to form the stress-inducing layer 218 such that it has the desired stress properties are well known to those skilled in the art. The thickness of the various layers of material may vary depending on the particular application and the device under construction. For example, the sidewall spacer 216 may have a base thickness that ranges from 10-30 nm.

The source/drain regions 231 may be comprised of implanted dopant materials (N-type dopants for NFET devices and P-type dopant for PFET devices) that are implanted into the substrate 210 using known masking and ion implantation techniques. In the depicted example, the source/drain regions 231 are formed by epitaxially depositing a semiconductor material, e.g., silicon-germanium, in sigma-shaped cavities 213. The depth of the cavities 213 may vary depending on the particular application. In one illustrative embodiment, the sigma-shaped cavities 213 may be formed by performing an initial dry anisotropic etching process to define an initial trench and thereafter performing a crystalline orientation-dependent etching process to complete the formation of the sigma-shaped cavities 231. Such a crystalline orientation-dependent etching process is performed using a crystalline orientation-dependent etchant which has an etch rate that varies based upon the crystalline structure of the silicon substrate 210. Examples of such crystalline orientation-dependent etchants include TMAH (tetra methyl ammonium hydroxide), KOH (Potassium Hydroxide), EDP (Ethylene-Diamene-Pyrocatechol), etc. When etching crystalline silicon, TMAH exhibits a higher etch rate in the direction defined by the <100> plane than it does in the direction defined by the <111> plane, which are both depicted in FIG. 2A. After a complete reading of the present application, those skilled in the art will readily appreciate that the inventions disclosed herein are not limited to devices that employ the illustrative sigma-shaped source/drain regions 231 depicted in FIG. 2A. Those skilled in the art will also recognize that there are other features of the transistor 200 that are not depicted in the drawings for purposes of clarity. For example, so-called halo implant regions are not depicted in the drawings, as well as various layers or regions of silicon-germanium that are typically found in high performance PFET transistors. At the point of fabrication depicted in FIG. 2A, the sacrificial gate structure 205 has been exposed and is ready for removal.

Figure 2B:
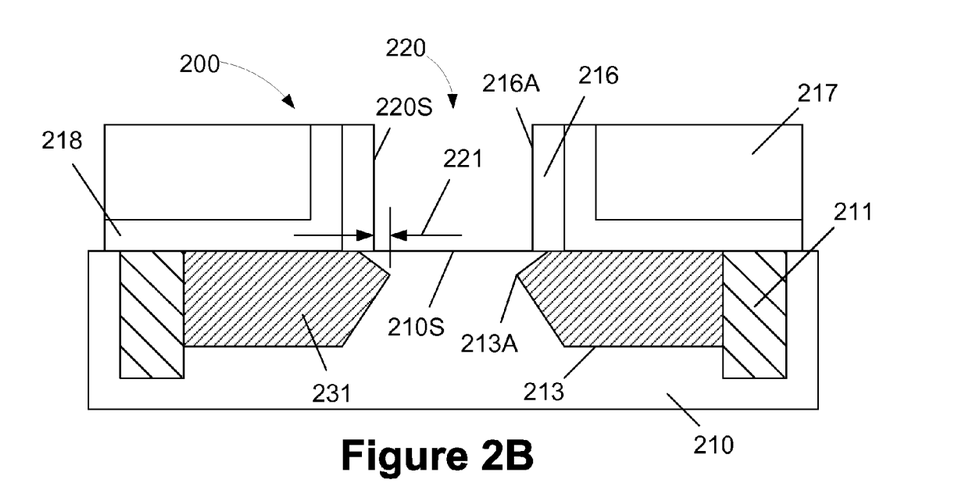

Next, as shown in FIG. 2B, one or more etching processes are performed to remove the sacrificial gate electrode 205B and the sacrificial gate insulation layer 205A to thereby define an initial gate opening 220 where a replacement gate structure will subsequently be formed. The initial gate opening 220 has sidewalls 220S that, in the illustrative embodiment depicted in the drawings, correspond to the inside surface 216A of the spacers 216. This etching process exposes the surface 210S of the substrate 210 for further processing. A masking layer that is typically used in such etching processes is not depicted for purposes of clarity. It should be noted that, in one illustrative embodiment, the formation of the sigma-shaped cavity 213 is controlled such that the inward peak penetration 213A of the cavity 213 is positioned a distance 221 inward of the sidewalls 220S of the initial gate opening 220. The magnitude of this distance 221 may vary depending upon the application and the device under construction. In one illustrative embodiment, the distance 221 may range from about 0-5 nm.

Figure 2C:
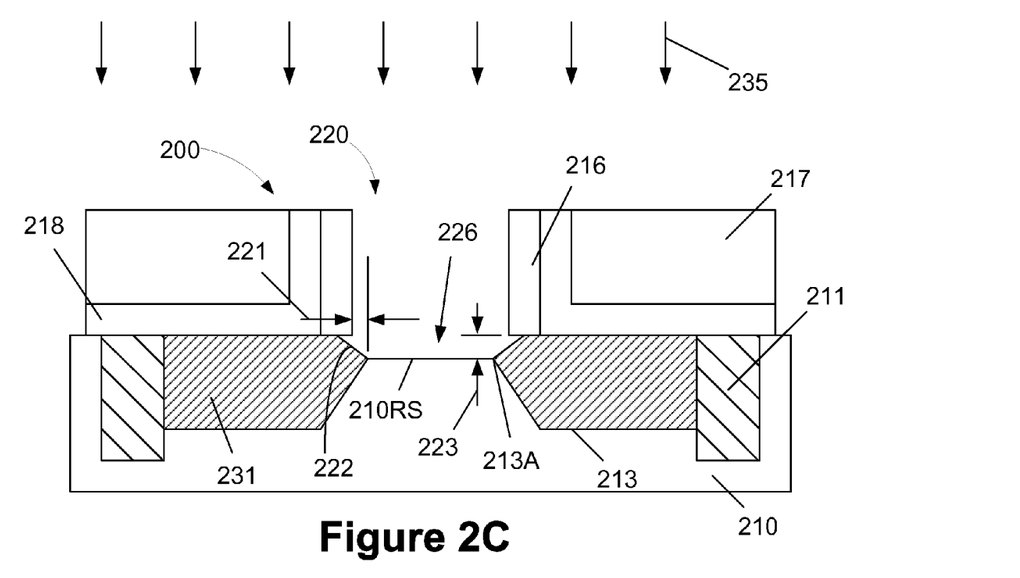

Next, as shown in FIG. 2C, in one illustrative embodiment, an anisotropic etching process 235 is performed through the initial gate opening 220 using, for example, a crystalline orientation-dependent etching process using KOH or TMAH, to define a recessed channel 226 in the substrate 210 for the transistor 200. This etching process creates a recessed surface 210RS in the substrate 210. These illustrative crystalline orientation-dependent wet etching process etches are anisotropic and etch silicon at different rates along different crystal orientations. The recessed channel 226 may also be created by performing a wet, gaseous or plasma etching process (or combinations thereof) through the gate opening 220, wherein such wet, gaseous or plasma etching processes may exhibit a combination of isotropic and anisotropic etching mechanisms. The depth 223 of the recessed channel 226 may vary depending upon the particular application and the type of device under construction. For example, in some embodiments, the depth 223 may range from about 10-30 nm. In one particularly illustrative example where the transistor 200 has sigma-shaped source/drain regions 231, the target depth 223 for the recessed channel 226 may be set so that the recessed surface 210RS is approximately at the same level or depth as the peak penetration 213A of the cavity 213. In one illustrative embodiment, the etching process 235 exposes a surface 222 that is positioned in the <111> plane of the substrate 210. More specific details of the geometry associated with the disclosed example of the recessed channel 226 are shown in FIG. 2G. Using the aforementioned wet, gaseous or plasma etching process (or combinations thereof) to define the recessed channel 226 may not result in the exposure of a surface 222 that is positioned in the <111> plane of the substrate 210 but would nevertheless produce some undercutting in the substrate 210 under the spacers 216.

Figure 2D:
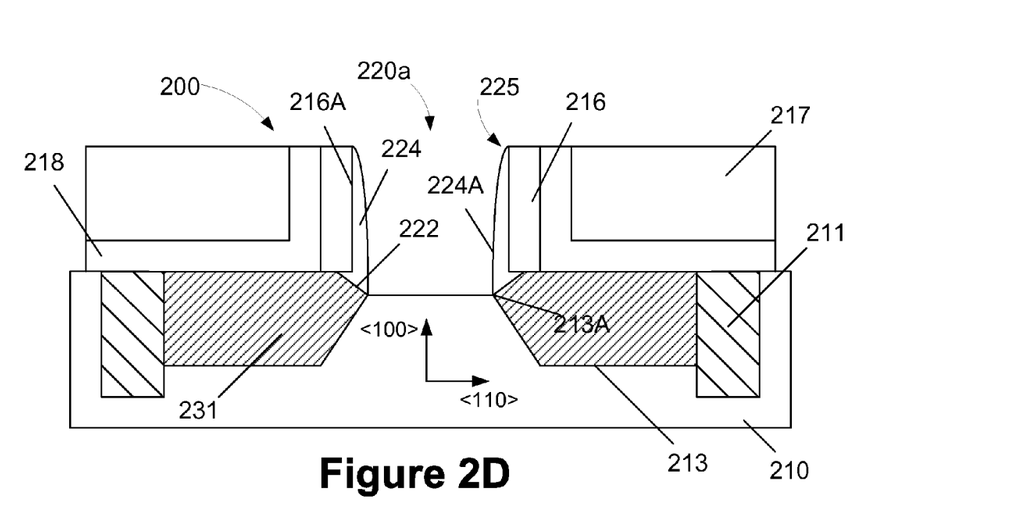

Then, as shown in FIG. 2D, a sidewall spacer 224 is formed on the sidewalls 220S of the initial gate opening 220 to define a final gate opening 220a that is smaller (in width) than the initial gate opening 220. The spacer 224 may be comprised of a variety of materials, e.g., silicon nitride, silicon dioxide, and its thickness may vary depending upon the particular application. In one illustrative embodiment, the sidewall spacer 224 may be comprised of silicon nitride, it may have a thickness that ranges from about 5-8 nm and it may be formed by conformably depositing a layer of spacer material and thereafter performing a dry anisotropic reactive ion etching process. Note that the spacer 224 substantially fills the space between the surface 222 and the bottom of the spacer 216. It should be further noted that, in the one particularly illustrative example where the transistor 200 has sigma-shaped source/drain regions 231, the inside 224A of the sidewall spacer 224 is approximately aligned with the peak penetration 213A of the cavity 213. By forming the spacer 224 inside the initial gate opening 220, a non-square-edged corner 225 is formed at the entrance of the final gate opening 220a. This non-square-edged corner 225 may be rounded or chamfered. The non-square-edged corner 225 may facilitate more efficient formation of various layers of material that will ultimately be formed in in the final gate opening 220a in forming the replacement gate structure. More specifically, the non-square-edged corner 225 may help reduce the likelihood of void formation when such layers of material are being formed. After the spacers 224 are formed, an anneal (e.g., about 700-1000° C. for a duration of milliseconds to a few seconds) in, for example, a nitrogen/hydrogen ambient, may be performed on the transistor 200 to repair any damage or roughness on the recessed surface 210RS due to the anisotropic etching process that was performed to form the spacers 224.

Figure 2E:
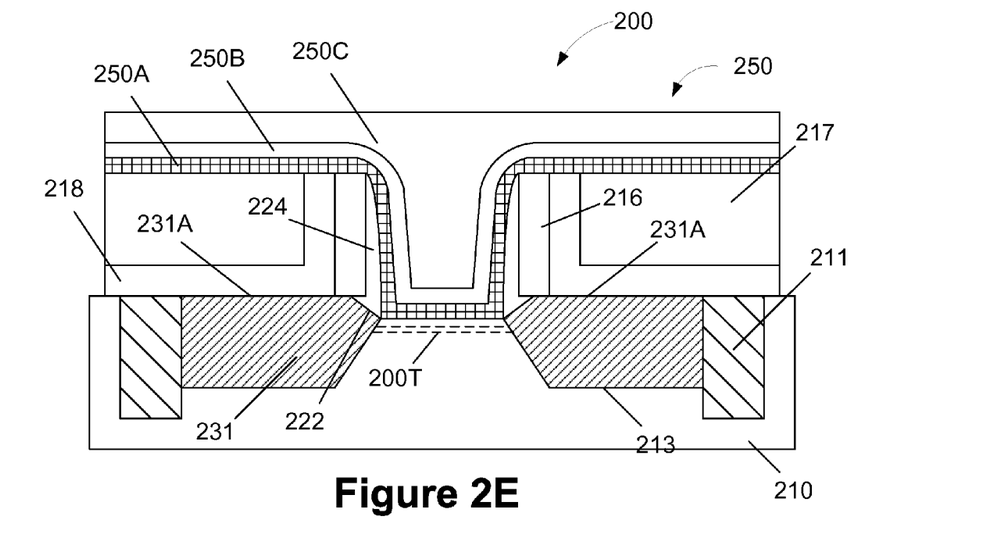

Next, as shown in FIG. 2E, various layers of material that will constitute a replacement gate structure 250 are formed in the final gate opening 220a. The replacement gate structure 250 may be formed using a variety of known techniques such as those described in the background section of this application. In one illustrative example, the replacement gate structure 250 is comprised of a high-k gate insulation layer 250A having a thickness of approximately 2 nm, a work function adjusting layer 250B comprised of a metal (e.g., a layer of titanium nitride with a thickness of 2-5 nm) and a bulk metal layer 250C (e.g., aluminum). As will be recognized by those skilled in the art after a complete reading of the present application, the insulating materials and the metal layer(s) that are part of the replacement gate structure 250 may be of any desired construction and comprised of any of a variety of different materials. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), and the like. Additionally, the replacement gate structure 250 for an NFET device may have different material combinations as compared to a replacement gate structure 250 for a PFET device. Thus, the particular details of construction of replacement gate structure 250, and the manner in which such replacement gate structure 250 is formed, should not be considered a limitation of the present invention unless such limitations are expressly recited in the attached claims. The methods disclosed herein may also employ replacement gate structures 250 that do not employ a high-k gate insulation layer; although a high-k gate insulation layer will likely be used in most applications.

Figure 2F:
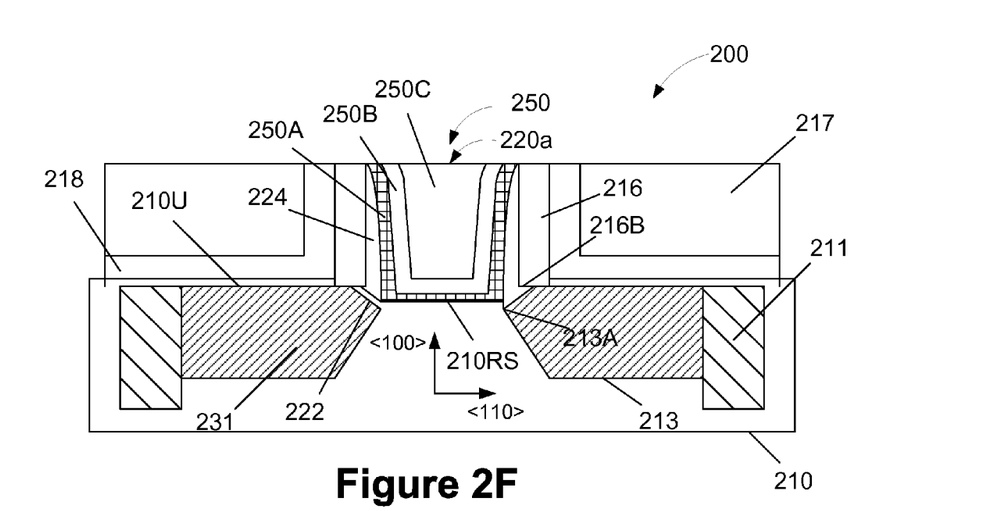
Figure 2G:
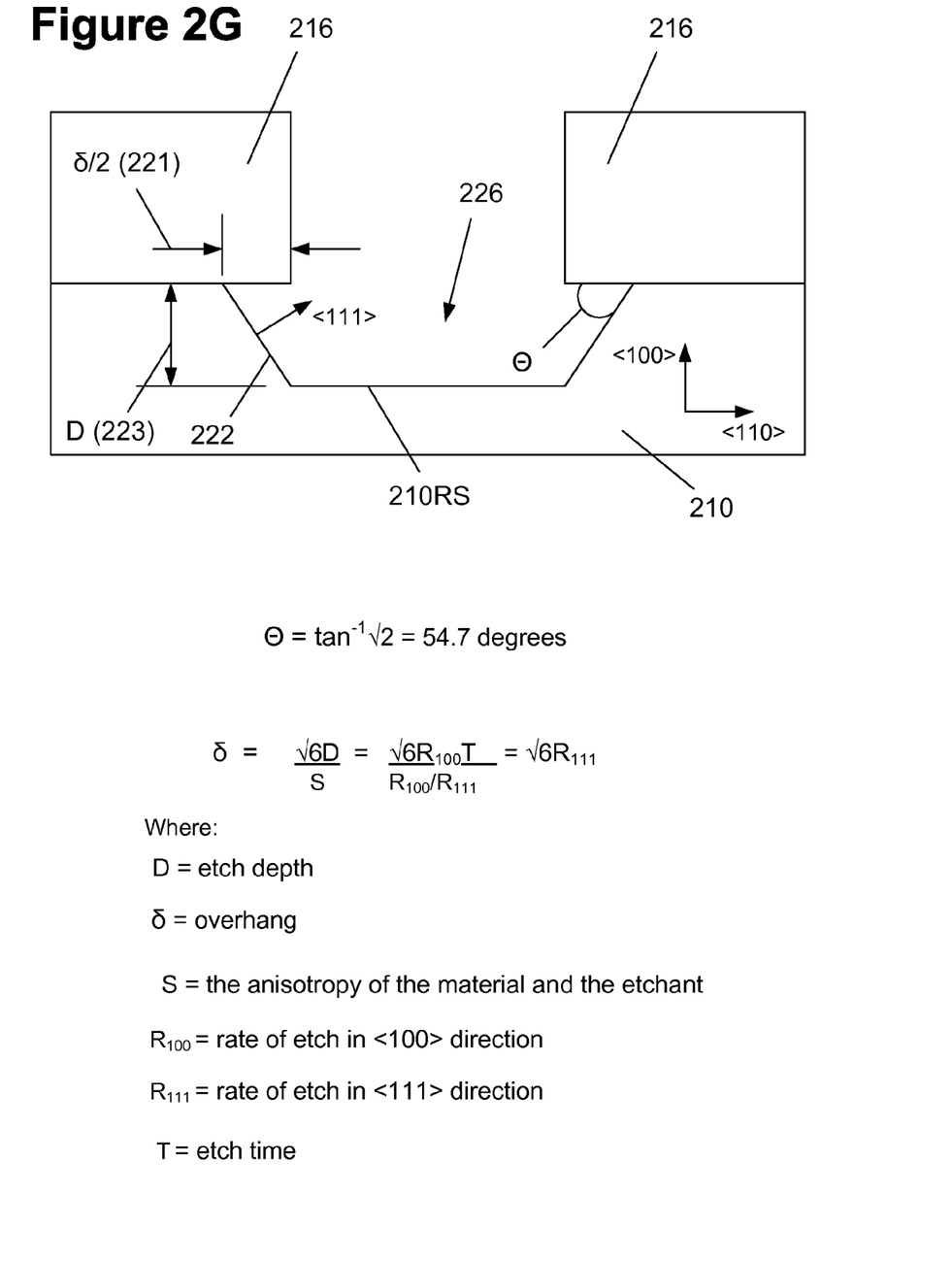

Next, as shown in FIG. 2F, a chemical mechanical polishing (CMP) process is performed to remove excess portions of the gate insulation layer 250A, the work function adjusting layer 250B and the bulk metal layer 250C positioned outside of the final gate opening 220a to define the replacement gate structure 250. Using the novel techniques disclosed herein, by forming the recessed channel 226, the upper surface 231A of the source/drain regions 231 is automatically positioned above the schematically depicted channel 200T of the transistor 200 when the channel forms during operation. Additionally, by forming the recessed channel 226, the channel 200T may be positioned closer to various stress-inducing materials to thereby enhance the performance of the transistor. In the illustrative example where the transistor 200 has sigma-shaped source/drain regions 231 that are formed so as to induce the desired stress in the channel region 200T of the transistor 200, the target depth 223 for the recessed channel 226 may be set so that the recessed surface 210RS is approximately at the same level or depth as the peak penetration 213A of the cavity 213 and the stress-inducing material formed therein.

As can be seen in the FIG. 2F, the recessed surface 210RS of the recessed channel 226 is separated from the upper surface 210U of the substrate 210 by the tapered surface 222. In one specific example, the tapered surface 222 may be positioned in the <111> crystallographic plane of the substrate 210. With reference to FIG. 2G, the tapered surface 222 may be formed at a downward angle of about 55 degrees (54.7) relative to the upper surface of the substrate 210. It should be further noted that due to the fact that the spacer 224 is thicker at the bottom than it is at the top, the gate electrode portion (considered as a whole) of the replacement gate structure 250 is wider at the top of the gate electrode than it is at the bottom of the gate electrode. Additionally, a portion of the spacer 224 is positioned under a bottom surface 216B of the spacer 216 and essentially fills the region between the overhanging portion of the spacer 216 and the tapered surface 222.

At the point depicted in FIG. 2F, additional processing operations may be performed to complete the formation of the transistor 200, such as the formation of metal silicide regions (not shown), the formation of conductive contacts (not shown) to the source/drain regions 231 and the formation of multiple metallization layers (not shown) above the transistor 200 using known techniques. Of course, the total number of metallization layers may vary depending on the particular device under construction.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
   forming a sacrificial gate structure above a layer of silicon;
   forming a first sidewall spacer adjacent said sacrificial gate structure;
   removing said sacrificial gate structure to thereby define an initial gate opening having sidewalls defined by said first sidewall spacer and to expose a surface of said layer of silicon;
   performing an etching process on said exposed surface of said layer of silicon to define a recessed channel in said layer of silicon, wherein said etching process undercuts a region beneath said first sidewall spacer;
   after performing said etching process, forming a second sidewall spacer within said region beneath said first sidewall spacer and within said initial gate opening on said sidewalls of said initial gate opening to thereby define a final gate opening narrower than said initial gate opening and expose said layer of silicon; and
   forming a replacement gate structure in said final gate opening.

2. The method of claim 1, wherein forming said replacement gate structure comprises:
   forming a gate insulation layer on said recessed channel; and
   forming a gate electrode above said gate insulation layer.

3. The method of claim 2, wherein said gate insulation layer is a high-k insulating material and wherein said gate electrode is comprised of a metal.

4. The method of claim 1, wherein performing the etching process to define the recessed channel in said layer of silicon comprises performing the etching process such that the recessed channel has a non-square-edged floor.

5. The method of claim 1, further comprising forming source and drain regions for said transistor, said source and drain regions having an upper surface that is positioned at a level that is above a level of said recessed channel.

6. The method of claim 5, wherein said source and drain regions are formed in sigma-shaped cavities formed in said layer of silicon.

7. The method of claim 1, further comprising forming a plurality of sigma-shaped source/drain regions for said transistor in said layer of silicon, said sigma-shaped source/drain regions having peak inward penetration toward said recessed channel, wherein a level of said peak inward penetration is at a level that is proximate a level of said recessed channel.

8. The method of claim 7, wherein said level of said peak inward penetration is at the same level as said level of said recessed channel.

9. The method of claim 1, wherein the step of performing said etching process on said exposed surface of said layer of silicon to define said recessed channel in said substrate comprises performing a wet anisotropic etching process.

10. The method of claim 1, wherein the step of performing said etching process on said exposed surface of said layer of silicon to define said recessed channel in said layer of silicon comprises performing a wet, dry or plasma etch process exhibiting any combination of isotropic or anisotropic mechanisms.

11. A method of forming a transistor, comprising:
   forming a sacrificial gate structure above a layer of silicon;
   forming a first sidewall spacer adjacent said sacrificial gate structure;
   forming a plurality of source/drain regions for said transistor, said source/drain regions having an upper surface;
   removing said sacrificial gate structure to thereby define an initial gate opening having sidewalls defined by said first sidewall spacer and to expose a surface of said layer of silicon;
   performing an etching process through said initial gate opening on said exposed surface of said layer of silicon, wherein said etching process undercuts a region beneath said first sidewall spacer to define a recessed channel in said layer of silicon having a non-square-edged floor, wherein said upper surface of said source/drain regions is positioned at a level that is above a level of said recessed channel;
   after performing said etching process, forming a second sidewall spacer within said region beneath said first sidewall spacer and within said initial gate opening, wherein said second sidewall spacer is disposed on said sidewalls of said initial gate opening to thereby define a final gate opening having a non-square-edged entrance and wherein said final gate opening is narrower than said initial gate opening and exposes said layer of silicon; and
   forming a replacement gate structure in said final gate opening, said replacement gate structure comprising a gate insulation layer comprised of a high-k insulating material and a gate electrode comprised of at least one metal layer.

12. The method of claim 11, wherein said source/drain regions are sigma-shaped source/drain regions that have a peak inward penetration toward said recessed channel, and wherein a level of said peak inward penetration is at a level that is proximate said level of said recessed channel.

13. The method of claim 11, wherein the step of performing said etching process on said exposed surface of said layer of silicon to define said recessed channel in said layer of silicon comprises performing a wet anisotropic etching process.

14. The method of claim 11, wherein the step of performing said etching process on said exposed surface of said layer of silicon to define said recessed channel in said layer of silicon comprises performing a wet, dry or plasma etch process exhibiting any combination of isotropic or anisotropic mechanisms.

15. The method of claim 1, further comprising:
    forming a second sidewall spacer adjacent said sacrificial gate structure prior to removing said sacrificial gate structure, wherein removing said sacrificial gate electrode structure exposes said second sidewall spacer; and
    forming said first sidewall spacer on said second sidewall spacer.

16. The method of claim 11, further comprising:
    forming a second sidewall spacer adjacent said sacrificial gate structure prior to removing said sacrificial gate structure, wherein removing said sacrificial gate electrode structure exposes said second sidewall spacer; and
    forming said first sidewall spacer on said second sidewall spacer.

* * * * *